United States Patent
Valten (10) Patent No.: US 11,121,703 B2
(45) Date of Patent: Sep. 14, 2021

(54) TRANSMITTER MODULE, RECEIVER MODULE AND DATA TRANSMISSION SYSTEM

(71) Applicant: Rohde & Schwarz GmbH & Co. KG, Munich (DE)

(72) Inventor: Thomas Valten, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/863,136

(22) Filed: Apr. 30, 2020

(65) Prior Publication Data

US 2021/0044280 A1  Feb. 11, 2021

(30) Foreign Application Priority Data

Aug. 5, 2019  (EP) ..................................... 19190109

(51) Int. Cl.
*H03H 17/02* (2006.01)
(52) U.S. Cl.
CPC .... *H03H 17/0273* (2013.01); *H03H 17/0213* (2013.01); *H03H 17/0266* (2013.01); *H03H 2017/0214* (2013.01)
(58) Field of Classification Search
CPC .......... H03H 17/0273; H03H 17/0213; H03H 17/0266; H03H 2017/0214
See application file for complete search history.

(56) References Cited

U.S. PATENT DOCUMENTS

| | | | |
|---|---|---|---|
| 7,317,750 B2 | 1/2008 | Shattil | |
| 7,558,310 B1* | 7/2009 | von der Embse | G06F 17/148 375/130 |
| 9,178,727 B2 | 11/2015 | Dore et al. | |
| 2004/0042557 A1* | 3/2004 | Kabel | H04B 1/406 375/260 |
| 2009/0110033 A1* | 4/2009 | Shattil | H04J 14/0298 375/141 |
| 2011/0007918 A1* | 1/2011 | Bauml | H04R 25/453 381/320 |
| 2013/0034189 A1* | 2/2013 | Ye | H04L 27/36 375/298 |
| 2013/0188797 A1* | 7/2013 | Jin | H04R 3/002 381/66 |
| 2014/0223067 A1* | 8/2014 | Heller | H04L 25/0266 710/306 |

(Continued)

OTHER PUBLICATIONS

Farhang-Boroujeny, B., "OFDM Versus Filter Bank Multicarrier," IEEE Signal Processing Magazine, pp. 92-112, May 2011.

*Primary Examiner* — Jaison Joseph
(74) *Attorney, Agent, or Firm* — Christensen O'Connor Johnson Kindness PLLC (57) ABSTRACT

A transmitter module for a broadband data transmission system for radio communications, comprising at least one polyphase FFT filter bank is described. The at least one polyphase FFT filter bank is established as a synthesis polyphase FFT filter bank, wherein the at least one polyphase FFT filter bank comprises several filter units, wherein the transmitter module is configured to receive an input signal comprising a symbol sequence, and wherein the transmitter module is configured to transmit a signal based on the received input signal. Moreover, a receiver module for a broadband data transmission system and a data transmission system are described.

16 Claims, 9 Drawing Sheets

(56) References Cited

U.S. PATENT DOCUMENTS

2017/0012598 A1* 1/2017 Harris ................ H03H 7/12
2017/0134203 A1* 5/2017 Zhu ................ H04L 27/264
2017/0331649 A1* 11/2017 Qu .................. H04L 25/03
2019/0036745 A1* 1/2019 Dzung ............ H04L 25/03159

* cited by examiner

TRANSMITTER MODULE, RECEIVER MODULE AND DATA TRANSMISSION SYSTEM

FIELD OF THE DISCLOSURE

The present disclosure is related to a transmitter module for a broadband data transmission system. The present disclosure is further related to a receiver module for a broadband data transmission system as well as to a data transmission system for a broadband transmission of data.

BACKGROUND

Different techniques for a broadband transmission of data via radio frequency are known from the state of the art. Examples for such techniques are direct sequence hopping, orthogonal frequency division multiplexing and shaped orthogonal frequency division multiplexing.

For certain applications like police radio or military radio, it is important that on one hand the transmitted signal is difficult to detect for everybody else than the designated recipient and that on the other hand it is difficult to jam the transmission, for example by using an interfering transmitter.

There is a need to provide a transmitter module for a broadband data transmission system, a receiver module for a broadband data transmission system as well as a data transmission system for a broadband transmission of data that allow for a secure and/or resilient transmission of RF signals.

SUMMARY

A transmitter circuit or module is provided for a broadband data transmission system for radio communications. In an embodiment, the transmitter module comprises at least one polyphase FFT filter bank. The at least one polyphase FFT filter bank is established as a synthesis polyphase FFT filter bank, wherein the at least one polyphase FFT filter bank comprises several filter units. The transmitter module is configured to receive an input signal comprising a symbol sequence. The transmitter module is configured to transmit a transmission signal based on the received input signal.

In the state of the art, a transmitter module usually comprises an analysis filter bank instead of a synthesis filter bank. According to the present disclosure, the synthesis polyphase FFT filter bank is used in the transmitter module instead of an analysis filter bank. Accordingly, the synthesis polyphase FFT filter bank is used to transform the received input signal in the time domain.

Each of the several filter units of the synthesis polyphase FFT filter bank receives the input signal. Further, each of the several filter units can be employed for transmitting the transmission signal without any oscillator that requires setting time (transient) in order to adapt to a desired transmission frequency, as is the case in the state of the art.

Thus, the transmitter module according to the present disclosure has the advantage that no parts of the input signal or rather of the symbol sequence are lost due to adjusting/setting times of oscillators, thereby providing a more resilient data transmission.

According to one aspect, each of the filter units is established as a Nyquist-filter and associated with a subcarrier. Nyquist-filters are characterized by particularly steep edges of their frequency response. Thus, the transmission signal comprises only small contributions from outside of the desired frequency ranges defined by the respective passing bands of the filter units. Put another way, it is hard to detect harmonic signal portions outside of the desired frequency ranges.

The subcarriers may be mutually orthogonal, in the sense that the frequency response of each associated individual filter unit has a zero at the peak of the frequency response of the neighbouring filter units.

In general, a compact transmission spectrum is achieved due to the steep edges.

In some embodiments, Nyquist transmission channels may be established that are used for transmitting the data, namely the radio signals.

According to another aspect, the transmitter module is configured to transmit on every second subcarrier. This way, transmissions on the individual subcarriers cannot interfere with each other. Thus, a particularly resilient data transmission is provided.

In a further embodiment, each of the filter units is established as a square-root-Nyquist-filter. This kind of filter has particularly steep edges of their frequency response. Thus, the transmission signal comprises particularly small contributions from outside of the desired frequency ranges defined by the respective passing bands of the filter units.

The filter units may have a M-fold oversampling, wherein M is an integer bigger than one. This way, the filter units can optimally process the input signal which may be up-sampled with an up-sampling factor of M/2 before filtering.

According to another aspect, the transmitter module comprises a spread sequence generator and a spreading unit, wherein the spread sequence generator is configured to generate a spread sequence and to forward the spread sequence to the spreading unit, and wherein the spreading unit is configured to spread the symbol sequence comprised in the input signal in frequency domain, for example wherein the spread sequence is a Kasami-sequence, for instance a cyclic shifted Kasami-sequence.

Thus, the carrier frequency for transmitting the symbols comprised in the input signal is changed based on the generated spread sequence, wherein only every second subcarrier may be used. This way, the different sub-channels do not interfere with one another and an enhanced transmission quality as well as an enhanced resilience against perturbations is achieved.

Generally, the spreading takes place in the frequency domain by the cyclic shifting, for example by the cyclic shifted Kasami-sequence. Put another way, spreading and cyclic shifting take place in the frequency domain.

In contrast to a traditional frequency hopping operation in which switching between different carrier frequencies takes place, the transmitter module using a cyclic shifting spreads the signal in the frequency domain, for example over the whole Nyquist range possible.

The Kasami sequence fulfils the requirement of minimal correlation between the individual members of the sequence have minimal correlation. Thus, it is a pseudo-random sequence.

Put another way, the Kasami sequence ensures that the radio signal to be transmitted is distributed in the frequency domain differently. This ensures that the radio signal cannot be detected easily.

Using the transmitter module described above, the transmission signal can even be transmitted, received and recovered with a negative signal-to-noise-ratio (using a logarithmic scale). Thus, radio signals can be used that have low transmission power and that are therefore hard to identify.

The transmitter module may be used by several users at the same time, i.e. several users may transmit a respective transmission signal simultaneously because the sub-channels used for the respective transmission do not interfere with each other.

Further, a receiver circuit or module is provided for a broadband data transmission system for radio communications. The receiver module comprises at least one polyphase FFT filter bank. The at least one polyphase FFT filter bank is established as an analysis polyphase FFT filter bank, wherein the at least one polyphase FFT filter bank comprises several filter units. The receiver module is configured to receive and process a transmission signal.

In the state of the art, a receiver module usually comprises a synthesis filter bank instead of an analysis filter bank. According to the present disclosure, the analysis polyphase FFT filter bank is used in the receiver module instead of a synthesis filter bank. Accordingly, the analysis polyphase FFT filter bank is used to transform the received transmission signal in the frequency domain.

Each of the several filter units of the analysis polyphase FFT filter bank receives the transmission signal simultaneously. Further, each of the several filter units can be immediately employed for receiving the transmission signal without any oscillator that requires setting time (transient) in order to adapt to a desired transmission frequency, as is the case in the state of the art.

Thus, the receiver module according to the present disclosure has the advantage that no parts of the input signal or rather of the symbol sequence are lost due to adjusting/setting times of oscillators, thereby providing a more resilient data transmission.

In one embodiment, each of the filter units is established as a Nyquist-filter and associated with a subcarrier. Nyquist-filters are characterized by particularly steep edges of their frequency response. Thus, the receiving characteristic of the filter units comprises only small contributions from outside of the desired frequency ranges defined by the respective passing bands of the filter units.

The subcarriers may be mutually orthogonal, in the sense that the frequency response of each associated individual filter unit has a zero at the peak of the frequency response of the neighbouring filter units.

In some embodiments, Nyquist transmission channels may be established that are used for transmitting the data, namely the radio signals.

In some embodiments, the receiver module is configured to receive on every second subcarrier. More precisely, the receiver module receives on all sub-channels simultaneously, but only signals received on every second sub-channel which are associated with every second subcarrier may be processed. This matches the transmission characteristic of the transmitter module described above, which may be configured to transmit only on every second sub-channel.

Each of the filter units may be established as a square-root-Nyquist-filter. This kind of filter has particularly steep edges of their frequency response. Thus, the receiving characteristic of the receiver module comprises particularly small contributions from outside of the desired frequency ranges defined by the respective passing bands of the filter units.

According to another aspect, the filter units have a M-fold oversampling, wherein M is an integer bigger than one. This way, the filter units can optimally process the transmission signal.

According to a further aspect, the receiver module comprises a spread sequence generator and a de-spreading unit, wherein the spread sequence generator is configured to generate a spread sequence and to forward the spread sequence to the de-spreading unit, and wherein the de-spreading unit is configured to de-spread the symbol sequence comprised in the transmission signal in frequency domain, for example wherein the spread sequence is a Kasami-sequence, for instance a cyclic shifted Kasami-sequence. This way, the symbol sequence comprised in the transmission signal is recovered.

The hopping generator of the receiver module has to be synchronized with the hopping generator of the transmitter module for the symbol sequence to be recovered.

In some embodiments, the receiver module comprises several polyphase FFT filter banks, wherein each of the several polyphase FFT filter banks is established as an analysis polyphase FFT filter bank or as a synthesis polyphase FFT filter bank, wherein the several polyphase FFT filter banks each are configured to analyze a clock timing, a phase offset and/or a frequency offset and/or to synchronize the receiver module with a sender transmitting the transmission signal. This additional information can then be used for decoding the symbol sequence comprised in the transmission signal.

Generally, no leakage effect takes place in the receiver module due to the analysis polyphase FFT filter bank used to transform the received transmission signal in the frequency domain.

Therefore, the receiver module has a high interference resistance.

Further, a data transmission system is provided for a broadband transmission of data, comprising the transmitter module described above and/or the receiver module described above. Regarding the advantages, references is made to the explanations given above with respect to the transmitter module and/or the receiver module, respectively.

The transmitter module and the receiver module may establish Nyquist transmission channels due to the Nyquist-filter provided in the respective polyphase FFT filter banks.

In one embodiment, several transmitter modules and/or several receiver modules are provided, for example wherein the transmitter modules and/or the receiver modules are integrated on a common chip. Accordingly, the common chip is configured to generate a transmission signal and/or to receive and process the transmission signal. The common chip may relate to a field programmable gate array (FPGA) or an application-specific integrated circuit (ASIC), for example.

In some embodiments, the common chip is configured to generate, transmit and/or receive several transmission signals simultaneously via the several transmitter modules and/or the several receiver modules, respectively. Thus, a highly integrated data transmission system is provided.

Such an embodiment can be used for field testing, namely testing in real environments.

Generally, no cyclic prefix is necessary in contrast to the techniques known in the state of the art, as Nyquist transmission channels are established. In the prior art, cyclic prefix was necessary for cyclic continuation of the transmission signal. However, no data can be transmitted during the cyclic prefix. This drawback is overcome by the data transmission system, the transmitter module and/or receiver module mentioned above.

Furthermore, a complex data transmission is provided.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
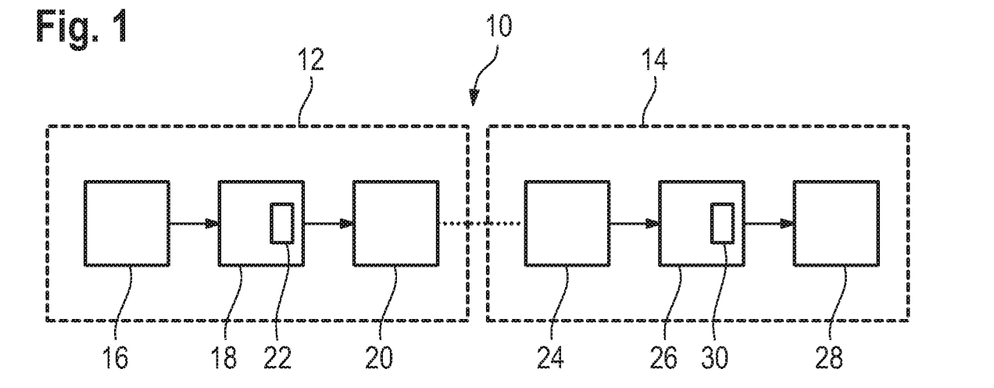
FIG. 1 schematically shows a block diagram of a data transmission system according to an embodiment of the disclosure.

FIG. 1 shows a representative example of a data transmission system 10 for a broadband transmission of data via radio communication. In the embodiment of FIG. 1, the data transmission system 10 comprises a transmitter circuit or module 12 and a receiver circuit or module 14. Generally speaking, the transmitter module 12 is configured to generate and transmit a transmission signal, and the receiver module 14 is configured to receive and process the transmission signal.

One or several such transmitter module(s) 12 and/or one or several such receiver module(s) 14 may be integrated on a common chip, integrated circuit, etc. Accordingly, the common chip is configured to generate the transmission signal and/or to receive and process the transmission signal. In some embodiments, the common chip is configured to generate, transmit and/or receive several transmission signals simultaneously via the several transmitter modules 12 and/or the several receiver modules 14, respectively.

In some embodiments, the common chip is implemented as or otherwise includes a field programmable gate array (FPGA) or an application-specific integrated circuit (ASIC), for example. Of course, at least some of the functionality of the transmitter module(s) and/or the receiver module(s) 14 can be carry out by discrete circuit components, program code, or the like.

The transmitter module 12 comprises a signal generator circuit or module 16, a Tx processing circuit or module 18 and a transmitter circuit or unit 20. The signal generator module 16 is connected to the Tx processing module 18 in a signal transmitting manner. The Tx processing module 18 in turn is connected to the transmitter unit 20 in a signal transmitting manner.

The signal generator module 16 is configured to generate an input signal, wherein the input signal comprises a symbol sequence. The symbol sequence corresponds to the data and/or to a message that is to be transmitted from the transmitter module 12 to the receiver module 14. Therein and in the following, the term "symbol sequence" is to be understood to comprise a bit sequence, symbols of a PAM-n coded signal and/or any other type of coded information in the form of a sequence of individual symbols.

The Tx processing module 18 comprises at least one polyphase FFT filter bank that is established as a synthesis polyphase FFT filter bank 22. Generally speaking, the Tx processing module 18 is configured to receive and process the input signal generated by the signal generator module 16, thereby generating a processed input signal. Several embodiments of the Tx processing module and their more precise functionality will be described in more detail below. All of these several embodiments have in common that the Tx processing module 18 comprises the synthesis polyphase FFT filter bank 22.

The transmitter unit 20 is configured to receive the processed input signal, and to generate and transmit the transmission signal. For example, the transmitter unit 20 comprises at least one antenna, for example at least one radio frequency antenna, that is configured to transmit the transmission signal. Of course, the transmitter unit 20 may comprise several antennas, for example one or several antenna arrays.

As shown in the embodiment of FIG. 1, the receiver module 14 comprises a front end 24, an Rx processing circuit or module 26 and an output channel 28. The front end 24 is connected to the Rx processing module 26 in a signal transmitting manner. The Rx processing module 26 in turn is connected to the output channel 28 in a signal transmitting manner.

The front end 24 is configured to receive the transmission signal and to forward the transmission signal to the Rx processing module 26. For example, the front end comprises at least one antenna, for example at least one radio frequency antenna, and suitable circuitry that is configured to receive the transmission signal. The front end 24 may also comprise several antennas, for example one or several antenna arrays.

The Rx processing module 26 comprises at least one polyphase FFT filter bank that is established as an analysis polyphase FFT filter bank 30. Generally speaking, the Rx processing module 26 is configured to receive and process the transmission signal, thereby generating a processed transmission signal. Moreover, the Rx processing module 26 is configured to forward the processed transmission signal to the output channel 28.

Several embodiments of the Rx processing module 26 and their more precise functionality will be described in more detail below. All of these several embodiments have in common that the Rx processing module 26 comprises an analysis polyphase FFT filter bank 30.

Figure 2:
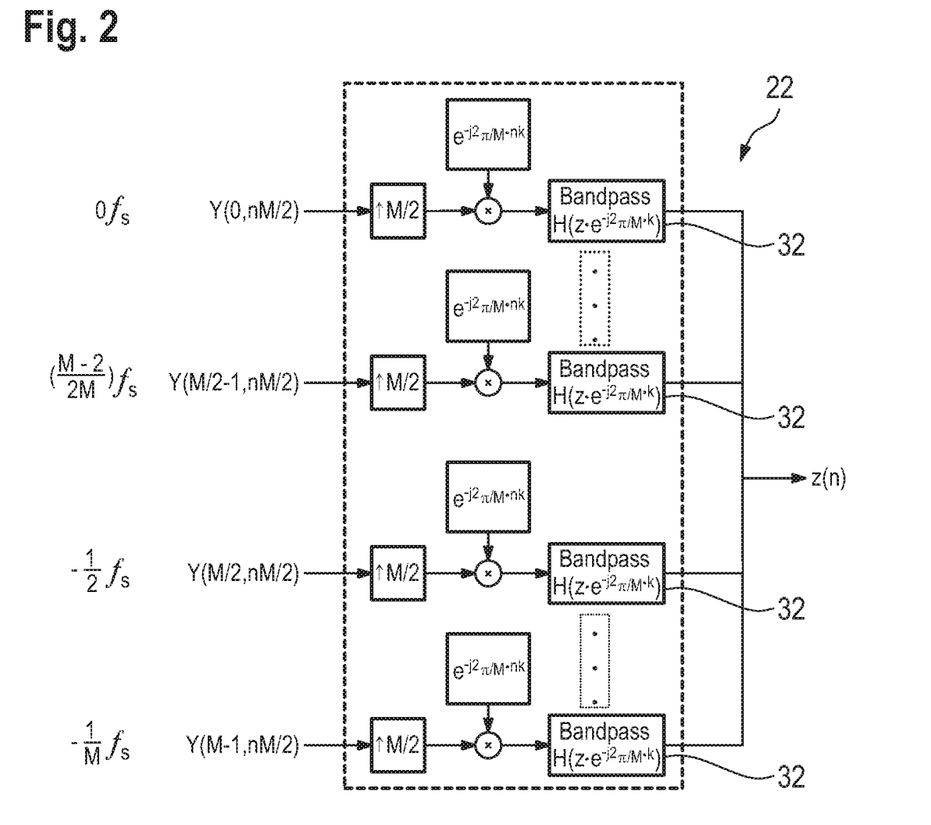
FIG. 2 shows an equivalent block diagram of a synthesis polyphase FFT filter bank according to an embodiment of the disclosure.

FIG. 2 shows an equivalent block diagram of the synthesis polyphase FFT filter bank 22 of the Tx processing module 18. The synthesis polyphase FFT filter bank 22 comprises several filter units 32. Each of the filter units 32 is established as a bandpass filter, i.e. each of the filter units 32 is associated with a specific frequency range that is able to pass the respective filter unit 32, while the remaining frequency ranges outside of the respective specific frequency range are filtered out.

Figure 3:
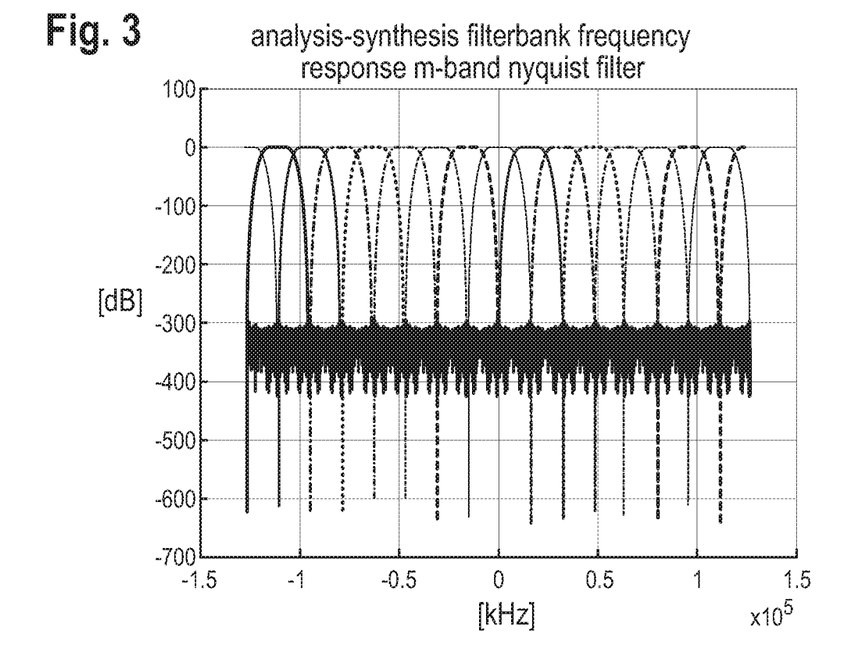
FIG. 3 shows a frequency response of a polyphase FFT filter bank.

In some embodiments, each of the filter units 32 is established as a Nyquist filter, for example as a square-root-Nyquist-filter. A representative frequency response of the synthesis polyphase filter bank 22, more precisely of the several filter units 32, is shown in FIG. 3.

The frequency ranges associated with the individual filter units 32 are mutually different. In other words, the individual frequency ranges may partially overlap each other, but their peaks are located at different frequencies.

In some embodiments, each of the individual frequency ranges forms a Nyquist channel, i.e. the frequency response of each individual filter unit 32 has a zero at the peak of the frequency response of the neighbouring filter units 32. In other words, each of the filter units 32 is associated with a sub-channel that corresponds to a subcarrier for the transmission of the transmission signal. The subcarriers are mutually orthogonal in the sense as described above, i.e. the frequency response of each individual filter unit 32 has a zero at the peak of the frequency response of the neighbouring filter units 32.

Each of the filter units 32 has a M-fold oversampling, wherein M is an integer bigger than one, for example an even integer bigger than one. This way, the filter units 32 can optimally process the input signal which is up-sampled with an up-sampling factor M/2, as is shown in FIG. 3.

Figure 4:
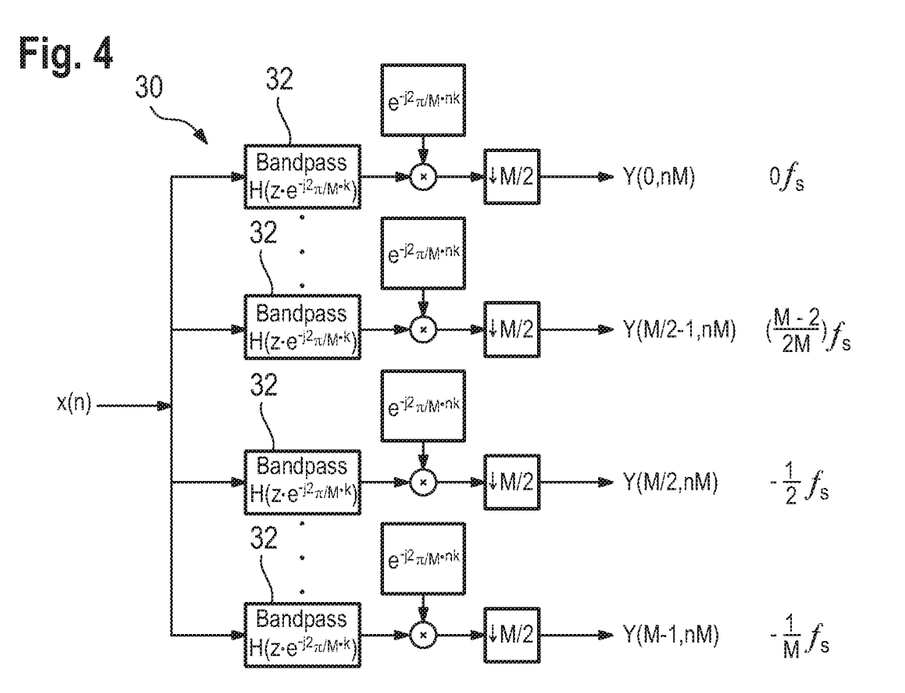
FIG. 4 shows an equivalent block diagram of an analysis polyphase FFT filter bank according to an embodiment of the disclosure.

FIG. 4 shows an equivalent block diagram of the analysis polyphase FFT filter bank 30. The analysis polyphase FFT filter bank 30 is established complementary to the synthesis polyphase FFT filter bank 22, in the sense that a concatenation of the synthesis polyphase FFT filter bank 22 and the analysis polyphase FFT filter bank 30 yields a perfect reconstruction of the original signal.

In other words, if G(z) is the transfer function of the synthesis polyphase FFT filter bank 22 and H(z) is the transfer function of the analysis polyphase FFT filter bank 30, it holds:

$$\sum_{l}^{M} H(z)G(z) = z^{-N}.$$

Accordingly, the analysis polyphase FFT filter bank 30 comprises the same number of filter units 32 as the synthesis polyphase FFT filter bank 22. Moreover, the filter units 32 of the analysis polyphase FFT filter bank 30 have the same frequency response as their respective counterpart filter unit 32 in the synthesis polyphase FFT filter bank 22.

Put differently, the analysis polyphase FFT filter bank 30 and the synthesis polyphase FFT filter bank 22 comprise pairwise identical filter units 32, i.e. for every filter unit 32 of the synthesis polyphase FFT filter bank 22, there is one identical filter unit 32 of the analysis polyphase FFT filter bank 30.

In the following, a first embodiment of the data transmission system 10, more precisely of the Tx processing module 18 and of the Rx processing module 26 will be described with reference to FIGS. 5 and 6, respectively.

Figure 5:
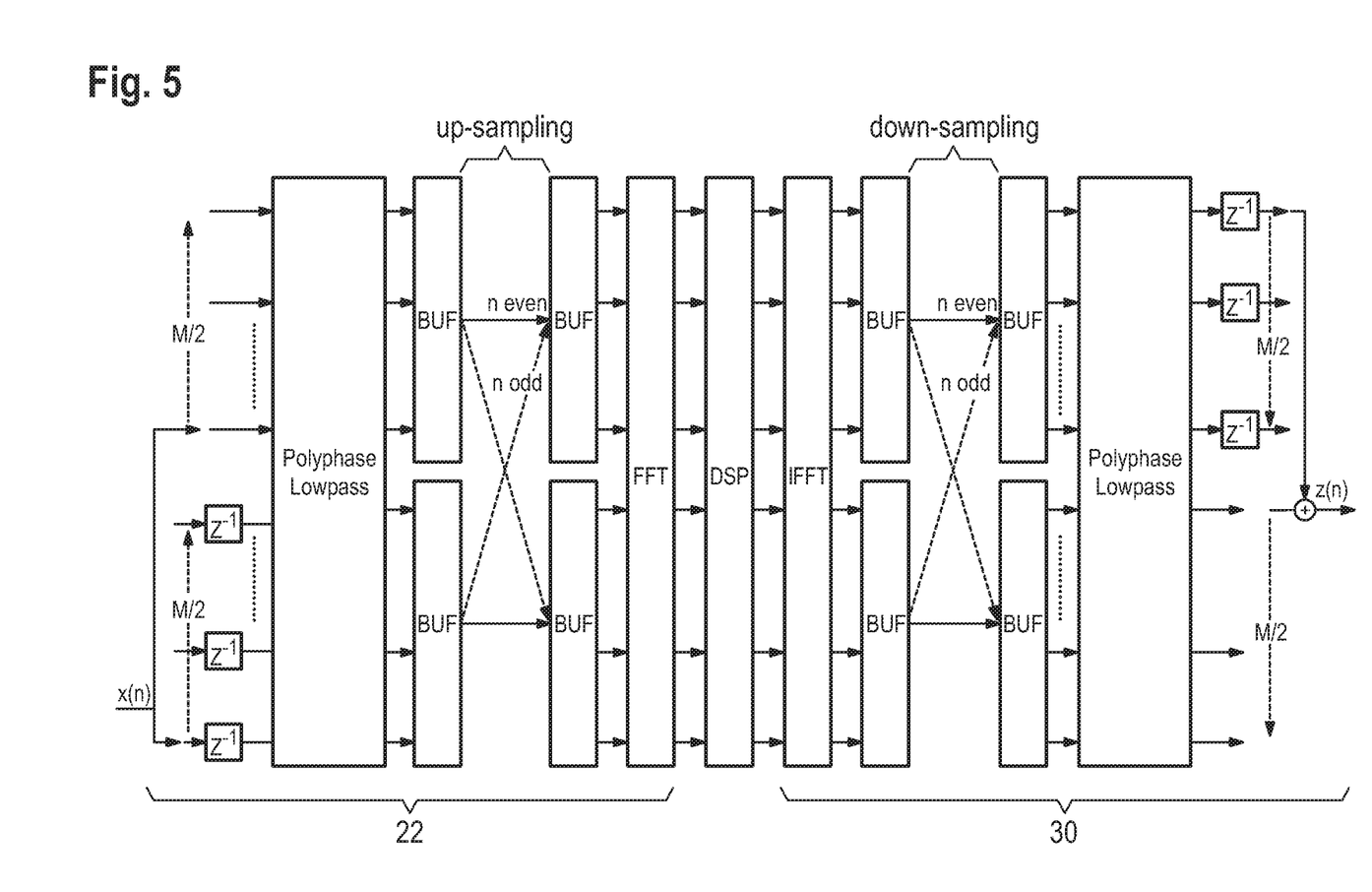
FIG. 5 shows a block diagram of a polyphaser FFT filter bank.

FIG. 5 shows a block diagram of a polyphase FFT filter bank comprising a transmitter side with the synthesis polyphase FFT filter bank 22 and a receiver side with the analysis polyphase FFT filter bank 30. Thus, FIG. 5 shows a block diagram of the components of the data transmission system 10 from the synthesis polyphase FFT filter bank 22 to the analysis polyphase FFT filter bank 30. Both the synthesis polyphase FFT filter bank 22 and the analysis polyphase FFT filter unit 30 each comprise a polyphase low-pass filter (polyphase lowpass) and several buffer units (BUF).

As is depicted in FIG. 5, a signal x(n) received by the synthesis filter unit 22 is forwarded to several branches, wherein a different delay is applied to the signal in every one of the branches, as is indicated by "$Z^{-1}$".

The signal is then filtered by the polyphase low-pass filter, buffered by the buffer units, up-sampled and finally Fourier transformed via a fast Fourier transform (FFT).

Afterwards, the signal is digitally processed (digital signal processing, DSP), which is a collective term to represent all manipulations of the signal between the synthesis polyphase FFT filter bank 22 and the analysis polyphase FFT filter bank 30. For example, "DSP" comprises sending the signal via the transmitter unit 20 and receiving the signal via the front end 24.

On the receiver side, the signal is inversely fast Fourier transformed (IFFT), buffered by the buffer units, down-sampled and filtered by the polyphase low-pass on the receiver side.

Figure 6:
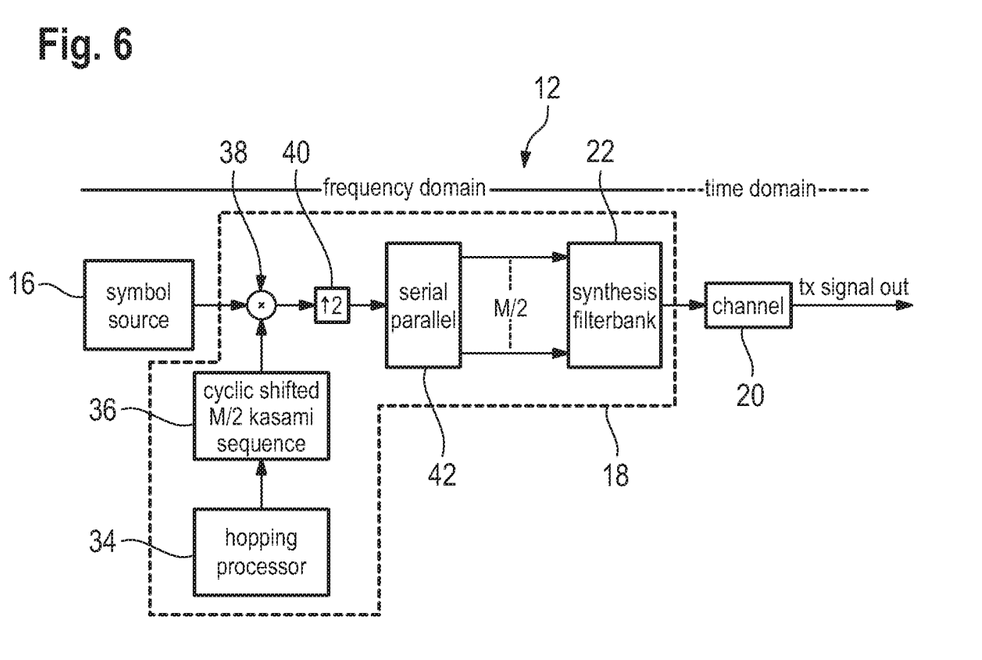
FIG. 6 schematically shows a block diagram of a transmitter module according to an embodiment of the disclosure.

FIG. 6 shows the transmitter module 12 comprising the signal generator module 16 labelled as "symbol source", the Tx processing module 18 and the transmitter unit 20 labelled as "channel" in more detail. The Tx processing module 18 comprises the synthesis polyphase FFT filter bank 22, a hopping circuit or processor 34, a spread sequence generator 36, a spreading circuit or unit 38, an up-sampling circuit or unit 40 and a serial-to-parallel converter 42.

The hopping processor 34 is connected with the spread sequence generator 36 in a signal transmitting manner. Moreover, the hopping processor 34 is configured to control the spread sequence generator 36, as will be described in more detail below.

Both the sequence generator 36 and the signal generator module 16 are connected to the spreading unit 38 in a signal transmitting manner. The spreading unit 38 comprises a mixer that is interconnected between the signal generator module 16 and the sequence generator 36.

The transmitter module 12, more precisely the Tx processing module 18, is configured to perform the following method for generating the processed input signal:

The hopping processor 34 controls the spread sequence generator 36 to generate a spread sequence. In some embodiments, the spread sequence is a Kasami sequence, preferably a cyclic shifted Kasami sequence as indicated in FIG. 6. The spread sequence is then forwarded to the spreading unit 38, for example the mixer.

The spreading unit 38, namely the mixer, receives both the spread sequence and the input signal comprising the symbol sequence. The spreading unit 38 then spreads the symbol sequence in frequency domain based on the spread sequence by means of a direct sequence hopping spread spectrum technique, thereby generating a spread input signal.

Put another way, the mixer receives and processes both the spread sequence and the input signal comprising the symbol sequence such that the spread input signal is outputted.

The spread input signal is up-sampled with an up-sampling factor of two by the up-sampling unit 40 and parallelized by the serial-to-parallel-converter 42.

The serial-to-parallel-converter 42 is connected to the synthesis polyphase FFT filter bank 22 such that each of the filter units 32 is connected to the serial-to-parallel-converter 42. This way, the spread input signal is applied to every one of the filter units 32.

Accordingly, each one of the filter units 32 filters the spread input signal, and the filtered partial signals are then recombined, thereby generating the transmission signal.

Therein, the hopping processor 34 controls the sequence generator 36 to generate the spread sequence such that the spread input signal cannot simultaneously pass filter units 32 that are adjacent to each other in frequency domain. In other words, the spreading sequence is generated such that the transmitter module 12 sends only on every second subcarrier.

Put differently, the symbol sequence is spread in frequency by the spreading unit 38 and afterwards filtered by the filter units 32, such that every portion of the symbol sequence only passes through one of the filter units 32 matching the frequency of the respective portion. The output of each of the filter units 32 corresponds to a portion of the spread input signal having a certain frequency.

Combining these portions having different frequencies is tantamount to a Fourier series. Thus, the transmission signal is the Fourier transform of the spread input signal. As shown in FIG. 6, the spread input signal is situated in frequency domain while the transmission signal is situated in time domain.

Figure 7:
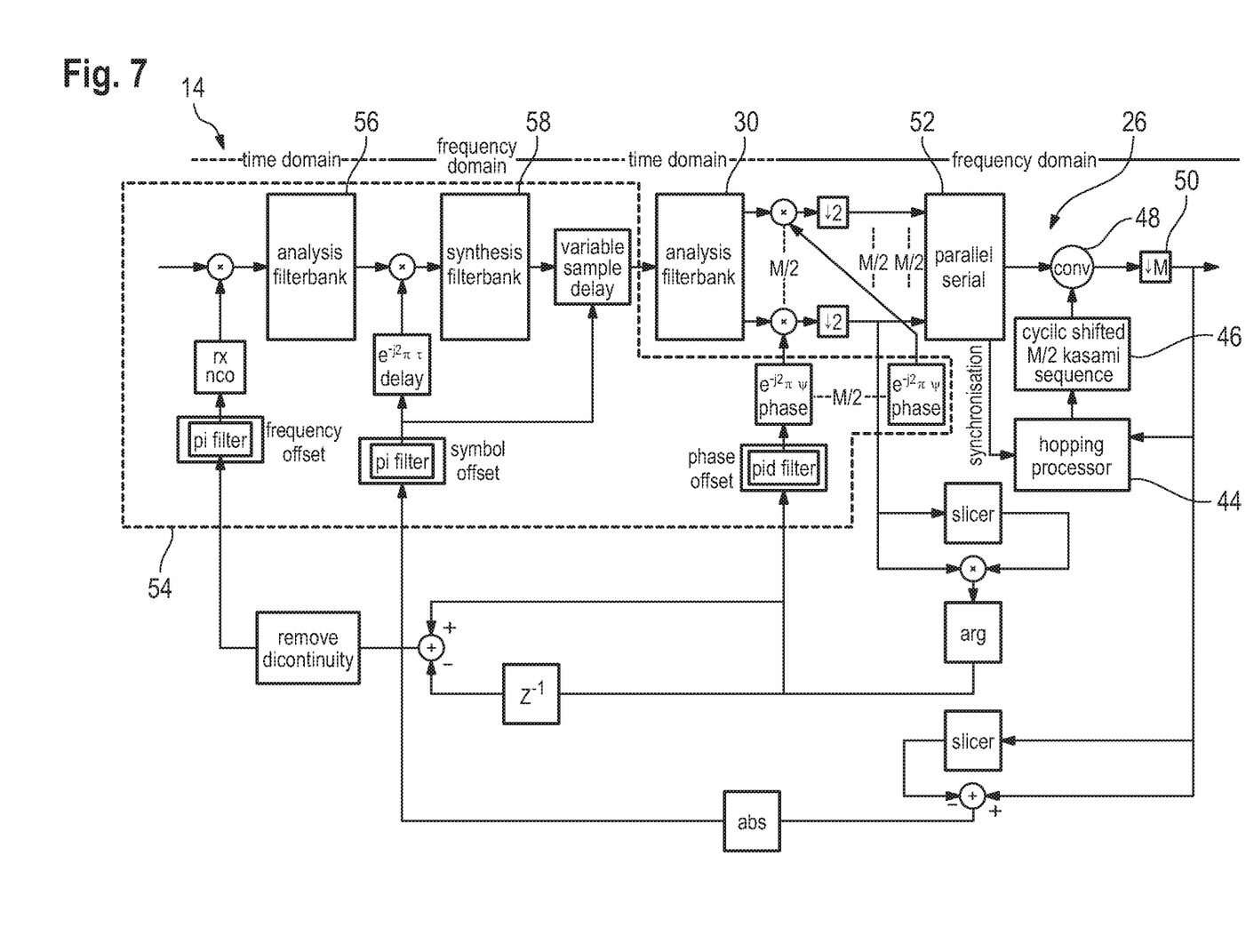
FIG. 7 schematically shows a block diagram of a receiver module according to an embodiment of the disclosure.

FIG. 7 shows the receiver module 14, more precisely the Rx processing module 26, according to the first embodiment of the data transmission system 10.

The Rx processing module 26 comprises the analysis polyphase FFT filter bank 30, a hopping circuit or processor 44, a spread sequence generator 46, a de-spreading circuit or unit 48, a down-sampling circuit or unit 50, a parallel-to-serial converter 52 and a signal analysis circuit or module 54.

The receiver module 14, more precisely the Rx processing module 26 is configured to perform the following method for receiving and processing the transmission signal received by the front end 24:

The transmission signal is first processed and analyzed via the signal analysis module 54. For this purpose, the signal analysis module 54 comprises at least one additional analysis polyphase FFT filter bank 56 and at least one additional synthesis polyphase FFT filter bank 58.

The signal analysis module 54, more precisely the at least one additional analysis polyphase FFT filter bank 56 and the at least one additional synthesis polyphase FFT filter bank 58, is configured to analyze a clock timing, a phase offset and/or a frequency offset of the received transmission signal.

Alternatively or additionally, the signal analysis module 56 may be configured to synchronize the receiver module 14 with the transmitter module 12.

The signal analysis module 54 is configured such that the transmission signal is forwarded to the analysis polyphase FFT filter bank 30 in an essentially unaltered way, may be up to a multiplication with a phase factor (for synchronizing the receiver module 14 with the transmitter module 12).

As becomes apparent from FIG. 4, the transmission signal is forwarded to all filter units 32 of the analysis polyphase FFT filter bank 30. Accordingly, the transmission signal is filtered by each of the filter units 32 and only the respective frequency components of the transmission signal are able to pass. In other words, the analysis polyphase FFT filter bank 30 analyzes the frequency components of the transmission signal, such that individual signals passing the individual filter unit 32 correspond to the Fourier components of the transmission signal.

Accordingly, while the transmission signal is situated in time domain, the individual transmission signal components after the analysis polyphase FFT filter bank 30 are situated in frequency domain, as illustrated in FIG. 7.

Afterwards, the individual frequency components of the transmission signal are serialized by the parallel-to-serial converter 52, thereby generating a serialized transmission signal.

Just like in the case of the transmitter module 12 described above, the hopping processor 44 of the receiver module 14 controls the spread sequence generator 46 to generate a spread sequence. In some embodiments, the spread sequence is a Kasami sequence, preferably a cyclic shifted Kasami sequence. The spread sequence is then forwarded to the de-spreading unit 48, for example a mixer assigned to the de-spreading unit 48.

Therein, the hopping processor 44 of the receiver module 14 is synchronized with the hopping processor 34 of the transmitter module 12, such that the spread sequence generator 46 of the receiver module 14 generates the same spread sequence as the spread sequence generator 36 of the transmitter module 12, with an appropriate delay.

The de-spreading unit 48 receives both the spread sequence generated by the spread sequence generator and the serialized transmission signal. The de-spreading unit 48 then de-spreads the serialized transmission signal, thereby recovering the input signal and the symbol sequence comprised in the input signal.

Finally, the recovered input signal is down-sampled by the down-sampling unit 50, for example by a down-sampling factor M.

Summarizing, the data transmission system 10 described above is configured to transmit a signal and/or data via a direct sequence hopping spread spectrum technique. Thus, the carrier frequency for transmitting the symbols comprised in the input signal is changed based on the generated spread sequence, wherein only every second sub-carrier is used. This way, the different sub-channels do not interfere with one another and an enhanced transmission quality as well as an enhanced resilience against perturbations is achieved.

Using the data transmission system 10 described above, the transmission signal can even be transmitted, received and recovered with a negative signal-to-noise-ratio (using a logarithmic scale).

The data transmission system 10 may be used by several users at the same time, i.e. several users may transmit a respective transmission signal simultaneously because the sub-channels used for the respective transmission do not interfere with each other.

The data transmission system 10 shown in FIGS. 6 and 7 can, without any changes of hardware, also be adapted to perform an orthogonal frequency division multiplexing (OFDM) technique, for example a shaped orthogonal frequency division multiplexing technique, which is explained in the following with reference to the second embodiment of the data transmission system 10 shown in FIG. 8.

Therein, parts or modules with like or similar functionality are labelled with the same numerals as in FIGS. 6 and 7

Figure 8:
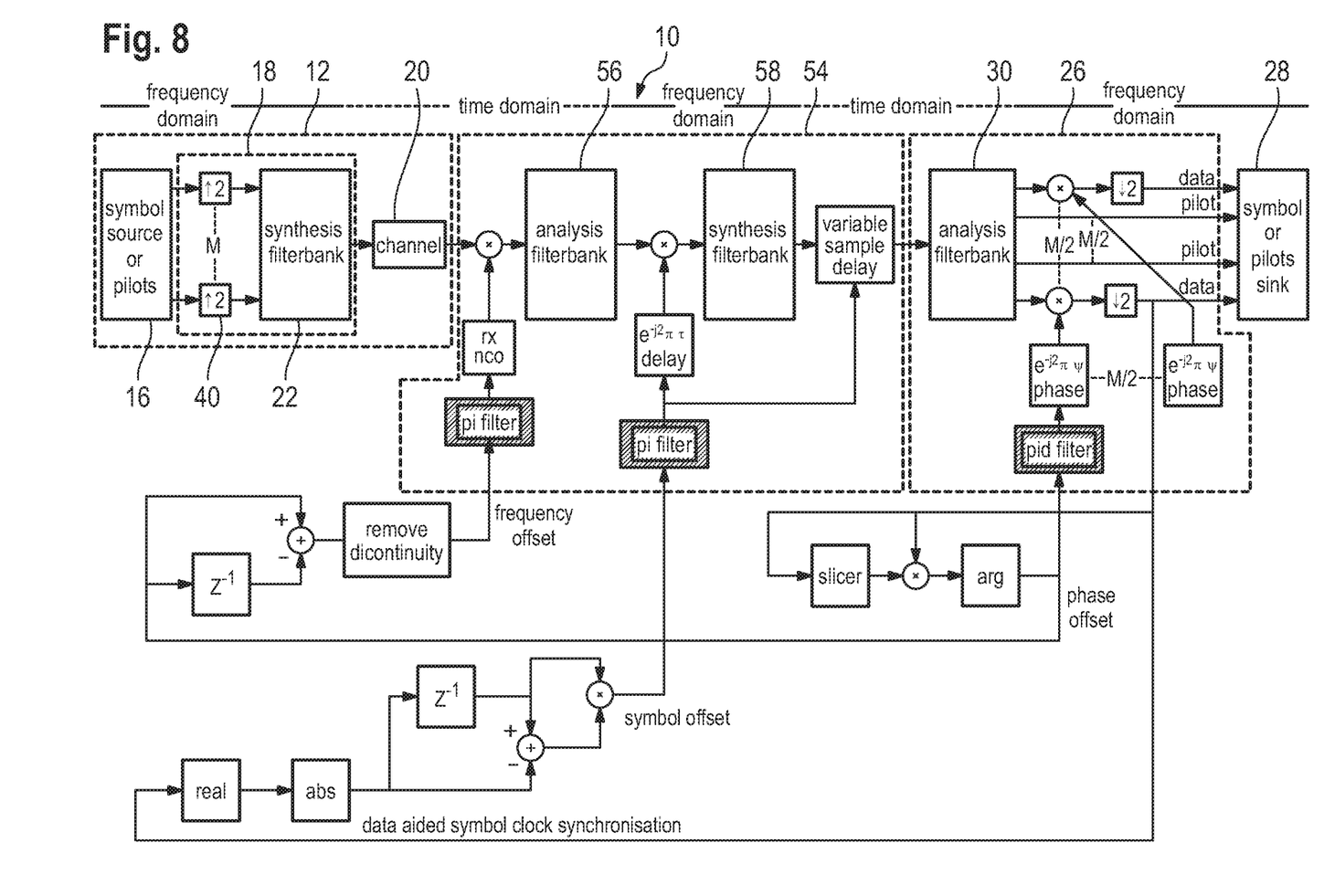
FIG. 8 schematically shows a block diagram of a data transmission system according to another embodiment of the disclosure.

The embodiment shown in FIG. 8 differs from the one shown in FIGS. 6 and 7 in that no hopping processors 34, 44 and no spread sequence generators 36, 46 are provided. However, the data transmission system 10 of FIGS. 6 and 7 can be adapted to perform the (shaped) orthogonal frequency division multiplexing method by deactivating the hopping processors 34, 44 and/or the spread sequence generators 36, 46.

The data transmission system 10 shown in FIG. 8 is configured to transmit a signal and/or data by means of the (shaped) orthogonal frequency division multiplexing technique on every second sub-channel, i.e. using every second sub-carrier, yielding the same advantages as described above.

Further, the data transmission system 10 may be configured to transmit a pilot signal from the transmitter module 12 to the receiver module 14 on at least one of the free sub-channels, i.e. on at least one of the sub-channels that are not used for transmitting the transmission signal.

The pilot signal may then be used for determining a transfer function of the respective sub-channel that is used for transmitting the pilot signal.

The determined transfer function can then be used to adapt the sending characteristics, also called transmitting characteristics, and/or the receiving characteristics of the transmitter module 12 and/or of the receiver module 14, respectively.

In some embodiments, the data transmission system 10 may be configured to interchange at least one of the transmission channels, i.e. at least one of the sub-channels on which the transmission signal is transmitted, and the at least one pilot channel. This way, the sending characteristics and/or the receiving characteristics of the transmitter module 12 and/or of the receiver module 14 can be adapted for the subsequent transmission of the transmission signal.

In the following, another embodiment of the data transmission system 10, more precisely of the Tx processing module 18 and of the Rx processing module 26 will be described with reference to FIGS. 9 and 10, respectively. Therein, parts or modules with like or similar functionality are labelled with the same numerals as in FIGS. 6 and 7. Moreover, only the differences with respect to the first embodiment of the data transmission system 10 will be described in the following.

Figure 9:
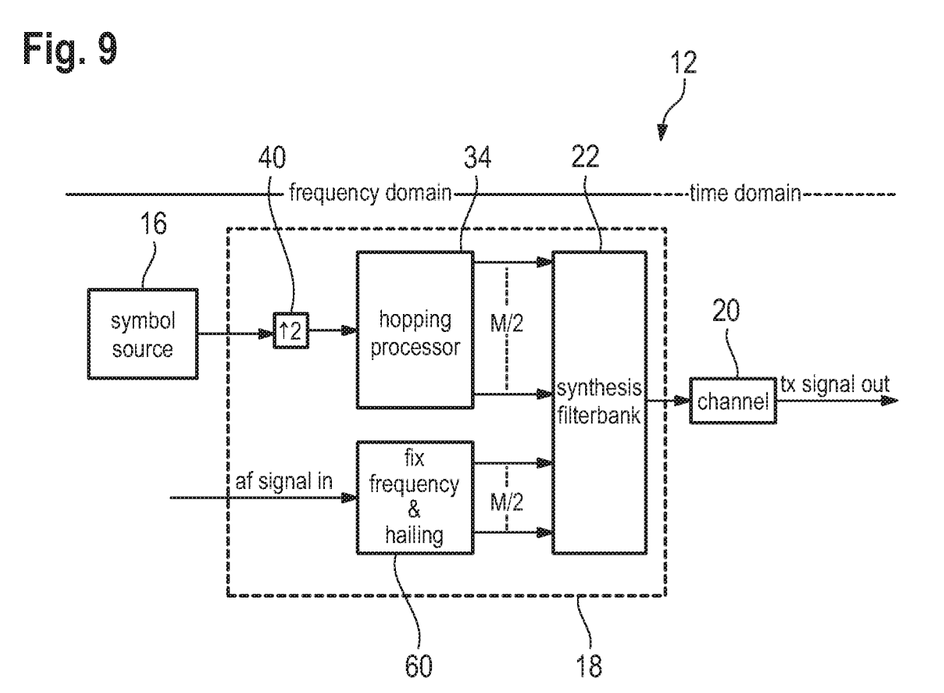
FIG. 9 schematically shows a block diagram of a transmitter module according to another embodiment of the disclosure.

FIG. 9 shows the transmitter module 12 comprising the signal generator module 16, the Tx processing module 18 and the transmitter unit 20 in more detail. Like in the first embodiment, the Tx processing module 18 comprises the synthesis polyphase FFT filter bank 22, a hopping processor 34 and an up-sampling unit 40. The hopping processor 34 is interconnected between the synthesis polyphase FFT filter bank 22 and the up-sampling unit 40 in a signal transmitting manner.

Additionally, the Tx processing module 18 may comprise a fixed frequency circuit or module 60 that is connected to the synthesis polyphase FFT filter bank 30 in a signal transmitting manner.

The transmitter module 12, more precisely the Tx processing module 18, is configured for perform the following method for generating the transmission signal:

As above, an input signal comprising a symbol sequence is generated by the signal generator 16. The input signal is forwarded to the up-sampling unit 40 and up-sampled with an up-sampling factor of two. Then, the up-sampled input signal is forwarded to the hopping processor 34.

The hopping processor 34 comprises several output channels, each of which is connected to one of the filter units 32 of the synthesis polyphase FFT filter bank 22, respectively. Accordingly, the hopping processor 34 controls to which of the filter units 32 the input signal is forwarded. Thus, the hopping processor 34 controls the momentary transmission frequency of the transmission signal generated by the synthesis polyphase FFT filter bank 22.

Just as described above, the transmission signal is then forwarded to the transmitter unit 20 and is transmitted by the transmitter unit 20. In other words, the transmitter module 12 is configured to transmit the transmission signal based on the received input signal by means of a frequency hopping technique.

Therein, the transmitter module 12 is configured to transmit the transmission signal only on every second sub-channel, i.e. to only use every second subcarrier.

The transmitter module 12 may be configured to transmit multiple transmission signals simultaneously, wherein each one of the multiple transmission signals is transmitted on another sub-channel. Once again, only every second sub-channel is used such that the several transmission signals do not interfere with each other.

Additionally, the transmitter module 12 may be configured to send on one or several sub-channels with fixed frequency, i.e. without frequency hopping. For this purpose, the fixed frequency module 60 is connected to one or several of the filter units 32 and is configured to forward the fixed frequency transmission signal to the one or several filter units 32.

Thus, multiple users may send at the same time, wherein the hopping processor 44 prevents a double occupancy of a single sub-channel.

Summarizing, the transmitter module 12 may be configured to transmit the transmission signal or several transmission signals by means of a frequency hopping technique and to additionally transmit the fixed frequency transmission signal or several fixed frequency transmission channels, for example a hailing signal, by a fixed frequency transmission technique.

Figure 10:
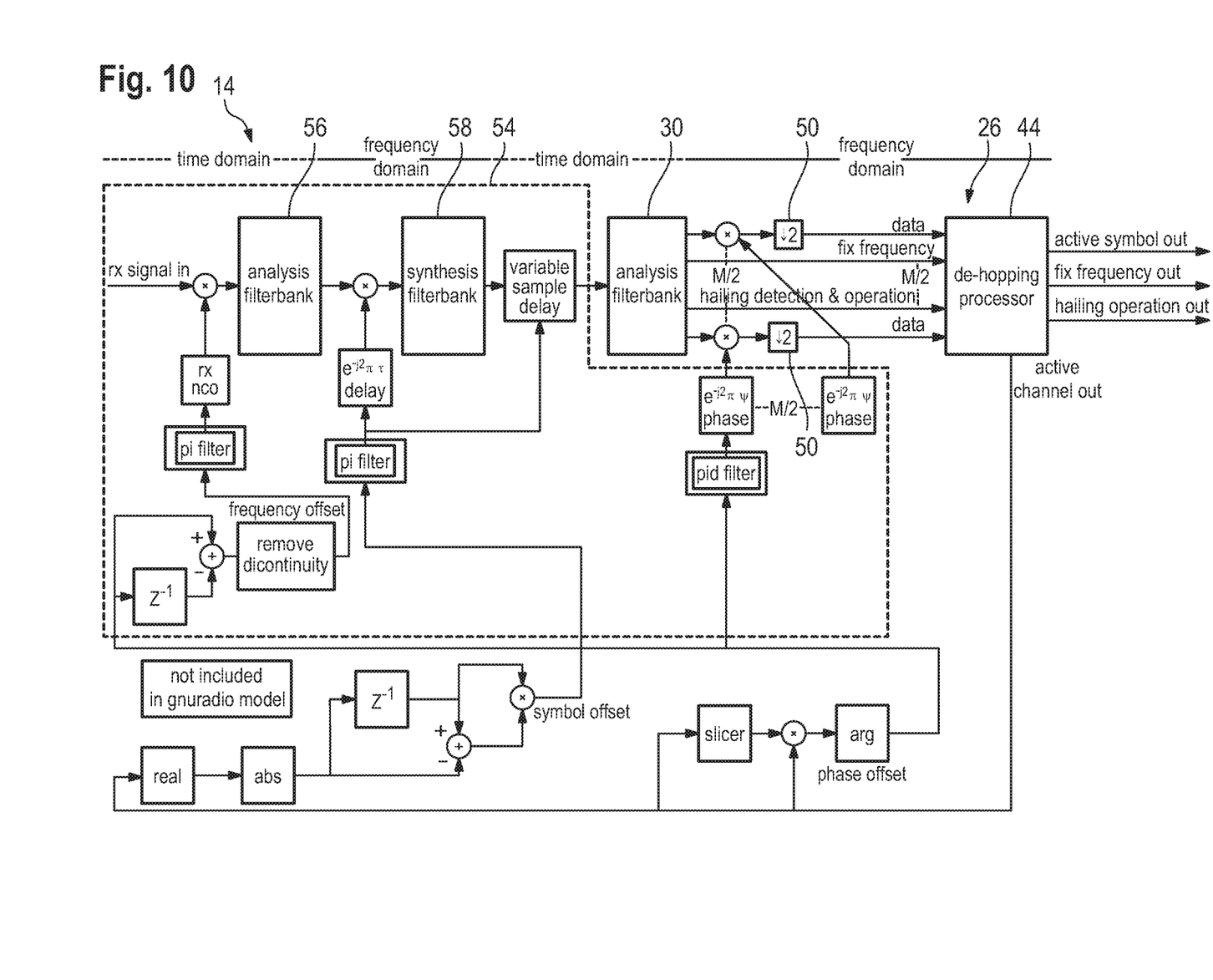
FIG. 10 schematically shows a block diagram of a receiver module according to another embodiment of the disclosure.

FIG. 10 shows the receiver module 14, more precisely the Rx processing module 26, comprising the analysis polyphase FFT filter bank 30 in more detail.

The Rx processing module 26 comprises a de-hopping processor 44, several down-sampling units 50 and a signal analysis module 54. The receiver module 14, more precisely the Rx processing module 26 is configured to perform the following method for receiving and processing the transmission signal received by the front end 24:

The transition signal is, just like in the embodiment described above, first processed and analyzed via the signal analysis module 54. Alternatively or additionally, the signal analysis module 54 may be configured to synchronize the receiver module 14 with the transmitter module 12.

The signal analysis module 54 is configured such that the transmission signal is forwarded to the analysis polyphase FFT filter bank 30 in an essentially unaltered way, may be up to a multiplication with a phase factor (for synchronizing the receiver module 14 with the transmitter module 12).

The transmission signal is forwarded to all of the filter units 32 of the analysis polyphase FFT filter bank 30 simultaneously, such that every one of the filter units 32 receives the transmission signal. Accordingly, there is no need for an oscillator of the receiver module 12 to adjust to the momentary transmission frequency, as all filter units 32 receive the transmission signal at all times.

After being filtered by each of the filter units 32, the transmission signal is down-sampled by the down sampling units 50 and forwarded to the de-hopping processor 44. The de-hopping processor 44 is synchronized with the hopping processor 34 and is configured to adjust a processing frequency of the received transmission signal. In other words, the de-hopping processor 44 is configured to determine which transmission signal on which sub-channel is forwarded to the output channel 28. Thus, the de-hopping processor 44 determines a momentary receiving frequency that matches the momentary transmission frequency such that the transmission signal and the symbol sequence comprised in the transmission signal can be received.

Moreover, the de-hopping processor 44 also determines, whether the fixed frequency transmission signal is forwarded to the output channel 28.

Of course, multiple transmission signals can be received and processed at the same time, just as multiple transmission signals can be sent by the transmitter module 12 at the same time.

Summarizing, the data transmission system 10 according to this embodiment is configured to transmit a signal and/or data by means of a frequency hopping technique. Thus, the hopping processor 34 determines the momentary transmission frequency, wherein only every second sub-carrier is used. This way, the different sub-channels do not interfere with one another and an enhanced transmission quality as well as an enhanced resilience against perturbations is achieved.

As all the filter units 32 of the receiver module 14 receive the transmission signal at the same time, there is no need for an oscillator to adjust to the momentary transmission frequency. Thus, no parts of the signal are lost due to an adjustment time of the respective oscillators.

The data transmission system 10 may be used by several users at the same time, i.e. several users may transmit a respective transmission signal simultaneously because the sub-channels used for the respective transmission do not interfere with each other.

For the simultaneous transmission of several transmission signals, orthogonal hop-sets may be used such that the individual transmissions of the respective users do not interfere with one another.

Figure 11:
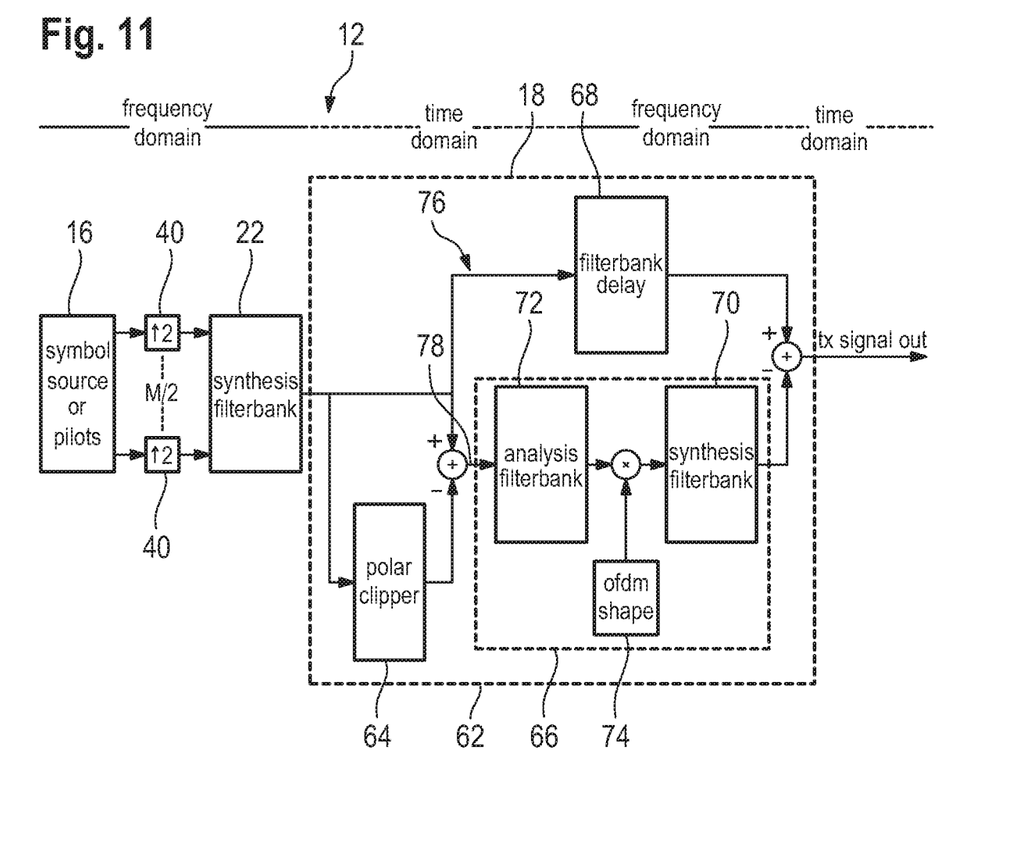
FIG. 11 schematically shows a block diagram of a transmitter module according to another embodiment of the disclosure.

FIG. 11 shows another embodiment of the transmitter module 12, more precisely of the Tx processing module 18. The Tx processing module 18 comprises the synthesis polyphase FFT filter bank 22, one or several up-sampling units 40 and a shaping circuit or module 62 that is connected to the synthesis polyphase FFT filter bank 22 downstream of the synthesis polyphase FFT filter bank 22.

Generally speaking, the part of the Tx processing module 18 outside of the shaping module 62 is configured to generate a transmission signal by an orthogonal frequency division multiplexing technique, for example by a shaped orthogonal frequency division multiplexing technique. Accordingly, this part of the Tx processing module 18 may be established similar or identical to the one described above with reference to FIG. 6 or FIG. 8.

Generally, the shaping module 62 is configured to reduce a crest factor of the transmission signal generated by the synthesis polyphase FFT filter bank 22. The shaping module 62 comprises a clipping circuit or module 64, a noise shaping circuit or module 66 and a delay circuit or module 68. In some embodiments, the clipping module 64 is established as a polar clipper, i.e. it is configured to cut off parts of the transmission signal exceeding a certain threshold amplitude.

The noise shaping module 66 comprises a noise shaping filter bank 70 that is established as a synthesis polyphase FFT filter bank, for example wherein the noise shaping filter bank 70 is established identically to the synthesis polyphase FFT filter bank 22.

Moreover, the noise shaping module 66 further comprises an analysis polyphase FFT filter bank 72 that is connected to the noise shaping filter bank 70 upstream of the noise shaping filter bank 70. Further, the noise shaping module 66 comprises an orthogonal frequency division multiplexing (OFDM) shape unit 74 that is located between the analysis polyphase FFT filter bank 72 and the noise shaping filter bank 70.

As can be seen in FIG. 11, the shaping module 62 has two branch lines 76, 78. The delay module 68 is assigned to the first branch line 76, while noise shaping module 66 is assigned to the second branch line 78, wherein the two branch lines 76, 78 are parallel to each other.

Figure 12:
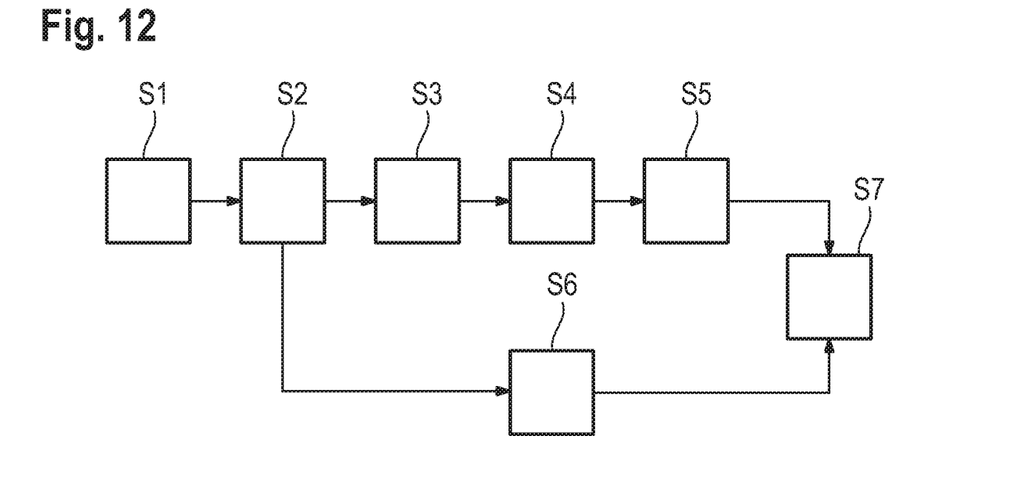
FIG. 12 schematically shows a flow chart of a method for a broadband transmission of data according to an embodiment of the disclosure.

The Tx processing module 18 is configured to perform a method for a broadband transmission of data that is described in the following with reference to FIG. 12:

First, the transmission signal is generated by the synthesis polyphase FFT filter bank 22 just as described above with respect to the first embodiment of the data transmission system 10 (step S1).

The generated transmission signal is then forwarded to the clipping module 64 and to the delay module 68 (step S2). The delay module 68 receives the generated transmission signal via the first branch line 76.

The clipping module 64 reduces the crest factor of the transmission signal by cutting off parts of the transmission signal exceeding the certain amplitude, thereby generating a clipped transmission signal (step S3).

The clipped transmission signal is then subtracted from the transmission signal, thereby generating a noise signal (step S4), which is forwarded via the second branch line 78.

The noise signal is then filtered via the noise shaping module 66, thereby generating a filtered noise signal (step S5). In step S5, intermodulation products are removed from the noise signal. In other words, the filtered noise signal comprises less noise artefacts from the clipping procedure in step S3 than the noise signal.

Parallel to steps S3 to S5, the transmission signal is delayed in a suitable manner by the delay module 68, thereby generating a delayed transmission signal (step S6).

The delayed transmission signal was delayed in a manner so as to match with the filtered noise signal outputted by the noise shaping module 66.

Finally, the filtered noise signal is subtracted from the delayed transmission signal (step S7).

The result of step S7 is a subtracted transmission signal that has a smaller crest factor compared to the transmission signal. Moreover, the subtracted transmission signal bears less intermodulation products compared to a method where the transmission signal is simply clipped without any further processing.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A transmitter circuit for a broadband data transmission system for radio communications, comprising:
   at least one polyphase FFT filter bank, wherein the at least one polyphase FFT filter bank is established as a synthesis polyphase FFT filter bank, wherein the at least one polyphase FFT filter bank comprises several filters,
   wherein the transmitter circuit is configured to receive an input signal comprising a symbol sequence, wherein the transmitter circuit is configured to transmit a transmission signal based on the received input signal;
   wherein the filters have a M-fold oversampling, wherein M is an integer greater than one, and/or
   wherein the transmitter circuit comprises a spread sequence generator and a spreading unit, wherein the spread sequence generator is configured to generate a spread sequence and to forward the spread sequence to the spreading unit, and wherein the spreading unit is configured to spread the symbol sequence comprised in the input signal in frequency domain.

2. The transmitter circuit of claim 1, wherein each of the filters is established as a Nyquist-filter and associated with a subcarrier.

3. The transmitter circuit of claim 2, wherein the subcarriers are mutually orthogonal.

4. The transmitter circuit of claim 2, wherein the transmitter circuit is configured to transmit on every second subcarrier.

5. The transmitter circuit according to claim 1, wherein each of the filters is established as a square-root-Nyquist-filter.

6. The circuit according to claim 1, wherein the spread sequence is Kasami-sequence.

7. A receiver circuit for a broadband data transmission system for radio communications, comprising:
   at least one polyphase FFT filter bank, wherein the at least one polyphase FFT filter bank is established as an analysis polyphase FFT filter bank, wherein the at least one polyphase FFT filter bank comprises several filters, wherein the receiver circuit is configured to receive and process a transmission signal;
   wherein the filters have a M-fold oversampling, wherein M is an integer greater than one; and/or
   wherein the receiver circuit comprises a spread sequence generator and a de-spreading unit, wherein the spread sequence generator is configured to generate a spread sequence and to forward the spread sequence to the de-spreading unit, and wherein the de-spreading unit is configured to de-spread the symbol sequence comprised in the transmission signal in frequency domain.

8. The receiver circuit of claim 7, wherein each of the filters is established as a Nyquist-filter and associated with a subcarrier.

9. The receiver circuit of claim 8, wherein the subcarriers are mutually orthogonal.

10. The receiver circuit of claim 8, wherein the receiver circuit is configured to receive on every second subcarrier.

11. The receiver circuit according to claim 7, wherein each of the filters is established as a square-root-Nyquist-filter.

12. The circuit according to claim 7, wherein the spread sequence is a Kasami-sequence.

13. The receiver circuit according to claim 7, wherein the receiver circuit comprises several polyphase FFT filter banks, wherein each of the several polyphase FFT filter banks is established as an analysis polyphase FFT filter bank or as a synthesis polyphase FFT filter bank, wherein the several polyphase FFT filter banks each are configured to analyze a clock timing, a phase offset and/or a frequency offset and/or to synchronize the receiver circuit with a sender transmitting the transmission signal.

14. A data transmission system for a broadband transmission of data for radio communications, comprising at least one of:
   at least one transmitter circuit comprising at least one polyphase FFT filter bank, wherein the at least one polyphase FFT filter bank is established as a synthesis polyphase FFT filter bank, wherein the at least one polyphase FFT filter bank comprises several filters, wherein the at least one transmitter circuit is configured to receive an input signal comprising a symbol sequence, wherein the at least one transmitter circuit is configured to transmit a transmission signal based on the received input signal; wherein the filters have a M-fold oversampling with M being an integer greater than one or wherein the transmitter circuit comprises a spread sequence generator and a spreading unit, the spread sequence generator being configured to generate a spread sequence and to forward the spread sequence to the spreading unit, and the spreading unit being configured to spread the symbol sequence comprised in the input signal in frequency domain, or at least one receiver circuit comprising at least one polyphase FFT filter bank, wherein the at least one polyphase FFT filter bank is established as an analysis polyphase FFT filter bank, wherein the at least one polyphase FFT filter bank comprises several filters, wherein the receiver circuit is configured to receive and process a transmission signal; wherein the filters have a M-fold oversampling with M being an integer greater than one; or wherein the receiver circuit comprises a spread sequence generator and a de-spreading unit, the spread sequence generator being configured to generate a spread sequence and to forward the spread sequence to the de-spreading unit, and the de-spreading unit being configured to de-spread the symbol sequence comprised in the transmission signal in frequency domain.

15. The data transmission system according to claim 14, wherein several transmitter circuit or several receiver circuit are provided.

16. The data transmission system according to claim 15, wherein the transmitter circuit or the receiver circuit are integrated on a common chip.

* * * * *